US010008626B2

(12) United States Patent
Muranaka

(10) Patent No.: US 10,008,626 B2
(45) Date of Patent: Jun. 26, 2018

(54) OPTICAL COUPLING DEVICE

(71) Applicant: KABUSHIKI KAISHA TOSHIBA, Tokyo (JP)

(72) Inventor: Tetsuya Muranaka, Kitakyushu Fukuoka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days. days.

(21) Appl. No.: 15/061,999

(22) Filed: Mar. 4, 2016

(65) Prior Publication Data
US 2017/0069781 A1 Mar. 9, 2017

(30) Foreign Application Priority Data

Sep. 4, 2015 (JP) .................. 2015-174611

(51) Int. Cl.
*H01L 31/173* (2006.01)
*H01L 33/62* (2010.01)
(Continued)

(52) U.S. Cl.
CPC ........ *H01L 31/173* (2013.01); *H01L 31/0203* (2013.01); *H01L 33/005* (2013.01);
(Continued)

(58) Field of Classification Search
CPC .................................................. H01L 31/173
See application file for complete search history.

(56) References Cited

U.S. PATENT DOCUMENTS 5,148,243 A * 9/1992 Merrick ................ H01L 31/167
250/239
5,647,034 A * 7/1997 Matsuda ............... H01L 31/167
257/82
(Continued)

FOREIGN PATENT DOCUMENTS

CN 103151419 A 6/2013
CN 104465640 A 3/2015
(Continued)

OTHER PUBLICATIONS

Taiwan Office Action dated Jan. 10, 2017, filed in Taiwan counterpart Application No. 105105546, 5 pages (with transiation).
(Continued)

*Primary Examiner* — Eugene Lee
(74) *Attorney, Agent, or Firm* — Patterson & Sheridan, LLP

(57) ABSTRACT

An optical coupling device includes a light-emitting element, a light-receiving element that faces the light-emitting element, a lead frame that has a first surface on which the light-emitting element is provided and a second surface facing the first surface, a first covering material that covers the light-emitting element, a second covering material that covers the first covering material, the light-receiving element, and the lead frame, and a third covering material that covers the second covering material. At least one of first bonding strength between the second covering material and the third covering material and second bonding strength between the second covering material and the second surface is lower than third bonding strength between the first covering material and the second covering material.

17 Claims, 5 Drawing Sheets

(51) Int. Cl.
*H01L 33/56* (2010.01)
*H01L 31/0203* (2014.01)
*H01L 33/00* (2010.01)

(52) U.S. Cl.
CPC .............. *H01L 33/56* (2013.01); *H01L 33/62* (2013.01); *H01L 2224/48091* (2013.01); *H01L 2933/005* (2013.01); *H01L 2933/0033* (2013.01)

(56) References Cited

U.S. PATENT DOCUMENTS

| | | | |
|---|---|---|---|
| 6,588,946 B1 * | 7/2003 | Mitsui | H01L 25/167 250/239 |
| 6,737,680 B2 * | 5/2004 | Hasegawa | H01L 21/4842 257/100 |
| 6,885,016 B2 * | 4/2005 | Worley | H02M 3/33523 250/227.24 |
| 7,307,285 B2 * | 12/2007 | Noguchi | H01L 25/167 250/214.1 |
| 9,293,672 B2 | 3/2016 | Park et al. | |
| 2003/0079895 A1 * | 5/2003 | Takakura | H01L 21/67144 174/529 |
| 2004/0241927 A1 * | 12/2004 | Kato | C08K 5/56 438/202 |
| 2005/0265659 A1 | 12/2005 | Miller | |
| 2008/0159691 A1 * | 7/2008 | Aki | H01L 31/173 385/24 |
| 2012/0006282 A1 | 1/2012 | Kates | |
| 2013/0087811 A1 * | 4/2013 | Takeshita | H01L 31/167 257/80 |
| 2013/0109115 A1 * | 5/2013 | Nagafuchi | B25B 11/02 438/25 |
| 2014/0054614 A1 * | 2/2014 | Tanaka | H01L 31/16 257/82 |
| 2014/0061678 A1 * | 3/2014 | Kotani | H01L 31/167 257/82 |
| 2014/0319560 A1 * | 10/2014 | Tischler | H01L 29/00 257/98 |
| 2014/0374776 A1 * | 12/2014 | Nakasuji | H01L 25/167 257/82 |
| 2015/0303180 A1 | 10/2015 | Noguchi et al. | |

FOREIGN PATENT DOCUMENTS

| | | |
|---|---|---|
| JP | 2004296906 A | 10/2004 |
| JP | 2008226909 A | 9/2008 |
| JP | 2009188167 A | 8/2009 |
| JP | 2011256251 A | 12/2011 |
| JP | 5060654 B2 | 3/2016 |
| TW | 200608074 A | 3/2006 |
| TW | 201347240 A | 11/2013 |

OTHER PUBLICATIONS

Chinese Office Action dated Nov. 16, 2017, filed in Chinese counterpart Application No. 2016101155460, 10 pages (with translation).

* cited by examiner

OPTICAL COUPLING DEVICE

CROSS-REFERENCE TO RELATED APPLICATION

This application is based upon and claims the benefit of priority from Japanese Patent Application No. 2015-174611, filed Sep. 4, 2015, the entire contents of which are incorporated herein by reference.

FIELD

Embodiments described herein relate generally to an optical coupling device.

BACKGROUND

There are optical coupling devices, including photorelays and photocouplers, having "double mold" structures. Generally, in a "double mold" structure, a light-emitting element and a light-receiving element are first covered with an inner mold resin, which is then covered with an outer mold resin.

In these "double mold" structures, stress is applied to the elements within when the device's ambient temperature changes, and thus there is a concern about device deteriorating due to this applied stress, particularly with regard to the light-emitting element within the device. A method has been adopted in which a light-emitting element is first covered with a silicone resin, which is then covered with the inner mold resin. The silicone resin is considered to provide a means of relaxing applied or induced stress which might otherwise affect the light-emitting element.

However, the temperature characteristics of the silicone resin are typically considerably different from the temperature characteristics of the inner mold resins in common usage. For this reason, when temperature changes occur, there will be a tendency for separation (peeling) to occur at the interface between the silicone resin and the inner mold resin due to, for example, differences in thermal expansion coefficients. When peeling occurs at this interface, a light path between the light-emitting element and the light-receiving element is degraded or blocked. Thereby, the amount of light received by the light-receiving element will be decreased, and thus there is a concern of light utilization efficiency being reduced.

DETAILED DESCRIPTION

In general, according to one embodiment, an optical coupling device includes a light-emitting element, a light-receiving element that faces the light-emitting element, a first lead frame (or portion thereof) that has a first upper surface on which the light-emitting element is provided and a second lower surface on a side of the first lead frame (or portion thereof) opposite the first upper surface, a first material (e.g., resin material) that covers the light-emitting element, a second material (e.g., resin material) that covers the first covering material, the light-receiving element, the first surface, and the second surface, and a third material (e.g., resin material) that covers the second covering material. At least one of (i) an adhesion strength between the second material and the third material and (ii) an adhesion strength between the second material and the second lower surface is less than an adhesion strength between the first material and the second material.

Hereinafter, example embodiments will be described with reference to the accompanying drawings. In the following, a description will be given focusing on a configuration of a photocoupler as an example of an optical coupling device. However, the present disclosure can be applied to optical coupling devices other than a photocoupler, for example, a photorelay.

First Embodiment

Figure 1:
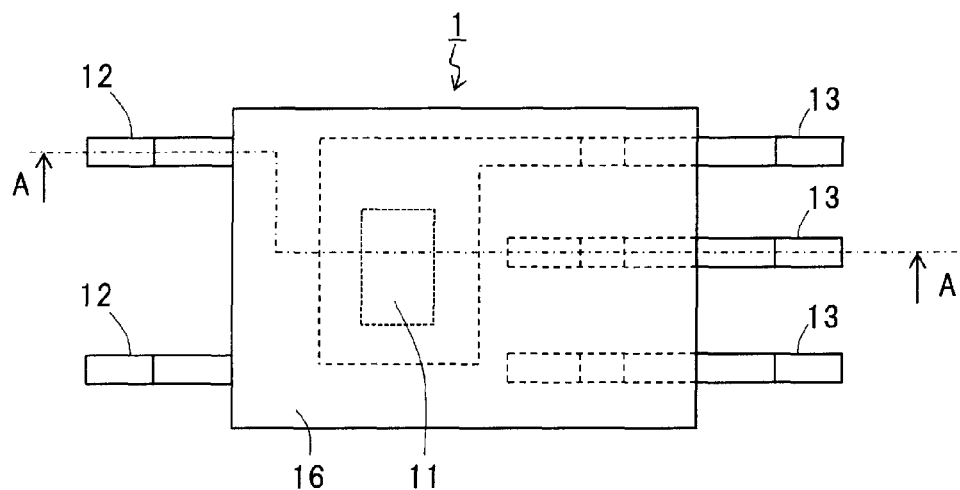
FIG. 1 is a plan view illustrating a schematic configuration of an optical coupling device according to a first embodiment.
Figure 2:
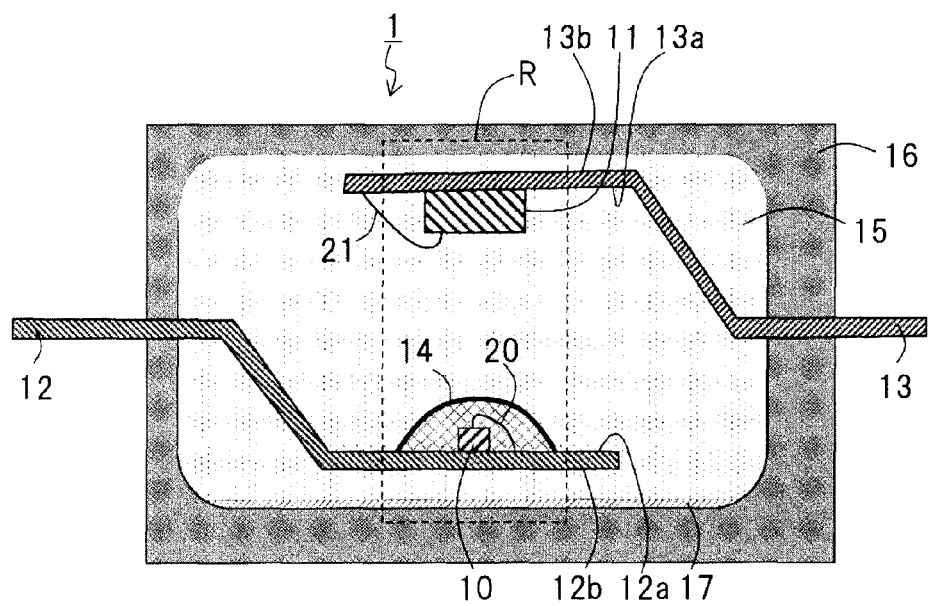
FIG. 2 is a cross-sectional view taken along line A-A illustrated in FIG. 1.
Figure 3:
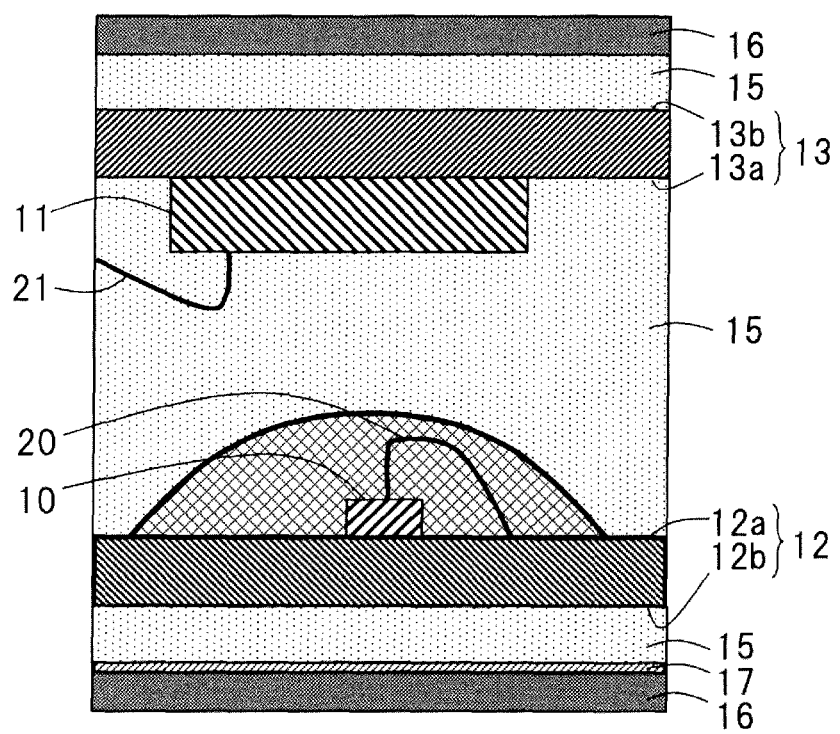
FIG. 3 is an enlarged view of a region R illustrated in FIG. 2.

FIG. 1 is a plan view illustrating a schematic configuration of an optical coupling device according to a first embodiment. FIG. 2 is a cross-sectional view taken along line A-A illustrated in FIG. 1. FIG. 3 is an enlarged view of a region R illustrated in FIG. 2.

As illustrated in FIGS. 1 to 3, an optical coupling device 1 includes a light-emitting element 10, a light-receiving element 11, lead frames 12 and 13, a first covering material 14, a second covering material 15, a third covering material 16, and a mold releasing agent 17.

The light-emitting element 10 is electrically connected to the lead frame 12 through a conductor 20 (e.g., a bonding wire). When a current is supplied from the lead frame 12 through the conductor 20 to the light-emitting element 10, the light-emitting element 10 radiates light toward the light-receiving element 11.

In the present embodiment, the light-emitting element is a light emitting diode (LED). However, the light-emitting element 10 is not limited to an LED and may be other types of light-emitting elements. In addition, the conductor 20 here is an aluminum bonding wire. However, the material of conductor 20 is not limited to aluminum, and may be other types of conductors, such as metals, such as gold.

The light-receiving element 11 is electrically connected to the lead frame 13 through a conductor 21 (e.g., bonding wire). When the light-receiving element 11 receives light of the light-emitting element 10, a current corresponding to the amount of light received is output from the light-receiving element 11 through the conductor 21 to the lead frame 13. In the present example, the conductor 21 is an aluminum bonding wire similar to the conductor 20. The material of conductor 21 is likewise not limited to aluminum, and may be other types of conductive materials, such metals, such as gold.

Each of the lead frames 12 and 13 includes a conductive portion such as a metal. The lead frame 12 includes a first surface 12a having the light-emitting element 10 provided thereon, and a second surface 12b facing the first surface 12a. The lead frame 13 includes a third surface 13a on which the light-receiving element 11 is provided facing the light-emitting element 10, and a fourth surface 13b facing the third surface 13a.

The optical coupling device 1 in this embodiment is provided with a plurality of lead frames 12 and a plurality of lead frames 13. The light-emitting element 10 is bonded to one of the plurality of lead frames 12 using solder, for example. The light-emitting element 10 is electrically connected to another lead frame 12 of the plurality of lead frames through the conductor 20.

In addition, the light-receiving element 11 is bonded to one of the plurality of lead frames 13 using solder, for example. The light-receiving element 11 is electrically connected to another lead frame 13 in the plurality of lead frames 13 through the conductor 20.

The first covering material 14 covers the light-emitting element 10. The first covering material 14 is, for example, a silicone resin. In the present embodiment, the first covering material 14 functions as an encapsulating resin that protects the light-emitting element 10.

The second covering material 15 covers the light-receiving element 11, the lead frames 12 and 13, and the first covering material 14. The second covering material 15 is a transparent resin capable of transmitting light emitted by the light-emitting element 10. In some embodiments, the second covering material 15 can be an inner molding resin material in current use in the art.

The third covering material 16 covers the second covering material 15. The third covering material 16 is, for example, a black resin having a light shielding property, for example a resin material incorporating carbon particles in an amount sufficient to be substantially opaque to light at relevant wavelengths. Thereby, it is possible to prevent light of the light-emitting element 10 from leaking to the outside and to prevent the light-receiving element 11 from erroneously operating due to outside light. In some embodiments, the third covering material 16 can be an outer molding resin in current use in the art.

In the present embodiment, the second covering material 15 may be referred to as an inner mold resin, and the third covering material 16 may be referred to as an outer mold resin. That is, in the present embodiment, a double mold structure is formed using the second covering material 15 and the third covering material 16.

The mold releasing agent 17 is an organic material which promotes a mold releasing operation, the mold releasing agent 17 may be, for example, a long-chain fatty acid. That is, the molding releasing agent 17 may lower the adhesion strength between the surfaces different materials which, absent the molding releasing agent 17, would have a greater adhesion strength and thus be less likely or more difficult to separate from each other. In the present embodiment, after the second covering material 15 is molded, the mold releasing agent 17 is applied onto the outer surface of the second covering material 15. Thereafter, the third covering material 16 is molded, and thus the mold releasing agent 17 is included between the second covering material 15 and the third covering material 16.

In the present embodiment, the mold releasing agent 17 is applied to a portion of the outer surface of the second covering material 15, specifically, to a region facing the second surface 12b of the lead frame 12 (lower surface of second covering material 15 in FIG. 2). However, the mold releasing agent 17 can also be applied over the entire outer surface of the second covering material 15.

Figure 4A:
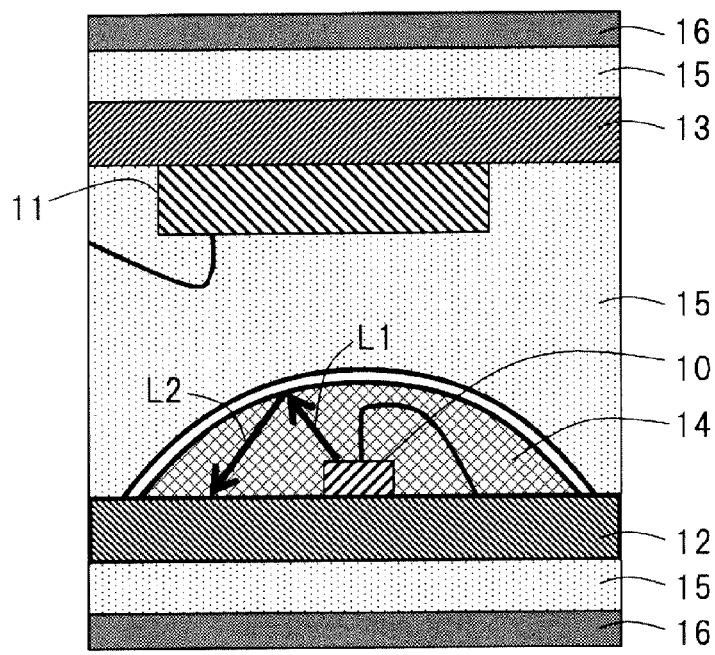
FIG. 4A is an enlarged cross-sectional view of a portion of an optical coupling device according to a comparative example.
Figure 4B:
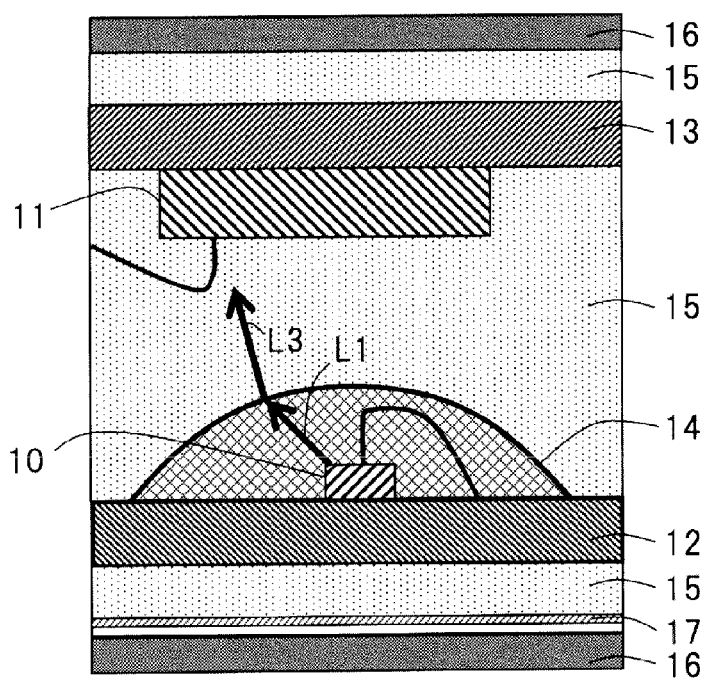
FIG. 4B is an enlarged cross-sectional view of a portion of the optical coupling device according to the first embodiment.

FIG. 4A is an enlarged cross-sectional view of a portion of an optical coupling device according to a comparative example, and FIG. 4B is an enlarged cross-sectional view of a portion of the optical coupling device 1 according to the present embodiment.

In the comparative example illustrated in FIG. 4A, a mold releasing agent 17 is not included between a second covering material 15 and a third covering material 16. In the present comparative example, the relative adhesion strength between the first covering material 14 and the second covering material 15 is lower than the adhesion strength between the second covering material 15 and the third covering material 16 (because there is no mold releasing agent 17 in the interface between second covering material 15 and third covering material 16 to alter (reduce) the adhesion strength between these materials). For this reason, when temperature rises, there is an increased possibility of peeling occurring at an interface between the first covering material 14 and the second covering material 15, as illustrated in FIG. 4A, because this interface has the lowest adhesion strength.

When peeling occurs at an interface, there will generally be an increase in light reflection due to an increased differential in the refractive indices of the interface materials (one of the interface materials will now be air/vacuum) as well as the creation of an additional interface in the light pathway (each of material 14 and material 15 will now have an interface with the peeling gap). Thus, as illustrated in FIG. 4A, when light L1 emitted from the light-emitting element 10 is incident on the peeled interface between the first covering material 14 and the second covering material 15, a greater amount, as compared to a case with a non-peeled interface, of the incident light L1 becomes reflected light L2 and a lesser amount of the incident light L1 will be transmitted to light-receiving element 11. As a result, the amount of light received by the light-receiving element 11 is decreased, and light utilization efficiency is reduced. As a countermeasure to this prospect of a peeled interface between materials 14 and 15, it is considered that the first covering material 14 might not be included in the device such that the light-emitting element 10 is directly covered with the second covering material 15. However, in this case, as discussed above, there would be a concern that the light-emitting element 10 would deteriorate due to stresses received from or applied by the second covering material 15.

On the other hand, according to the present embodiment illustrated in FIG. 4B, and as described above, mold releasing agent 17 is included between the second covering material 15 and the third covering material 16. In other words, according to the present embodiment, adhesion strength between the second covering material 15 and the third covering material 16 is effectively made lower than the adhesion strength between the first covering material 14 and the second covering material 15 by inclusion of the mold releasing agent 17 in the device. The adhesion strength between the second covering material 15 and the third covering material 16, as modified by the inclusion of mold releasing agent 17 therebetween, is also lower than the adhesion strength between the second covering material 15 and the second surface 12b. For this reason, when temperature rises, there is an increased possibility of peeling occurring preferentially at the interface between the second covering material 15 and the third covering material 16 as illustrated in FIG. 4B.

Specifically, when the mold releasing agent 17 is formed of an organic material (e.g., a vegetable-based oil or grease) the intervening material inhibits/prevents hydrogen bonding between the second covering material 15 and the third covering material 16, and thus peeling more easily occurs at the interface therebetween because adhesion strength is low.

When peeling occurs at this interface between materials 15 and 16, stress, which might otherwise affect the interface between the first covering material 14 and the second covering material 15, is relaxed by the release of energy associated with the peeling process. For this reason, adhesion between the first covering material 14 and the second covering material 15 is more likely to be maintained, and thus the interface therebetween is not likely to change so as to increase reflections of incident light L1. In other words, in the optical coupling device 1 according to the present embodiment, peeling at an interface between members that are not located on a light path from the light-emitting element 10 to the light-receiving element 11 is promoted in order to maintain the efficiency/operation of the light-emitting element 10.

Therefore, when the light L1 emitted from the light-emitting element 10 is incident on the (non-peeled) interface between the first covering material 14 and the second covering material 15, the majority of the incident light L1 is received by the light-receiving element 11 as emitted light L3. Consequently, it is unnecessary to eliminate the first covering material 14 from the device, and thus it is possible to maintain light utilization efficiency while still providing structure for relaxing stresses applied to the light-emitting element 10.

In addition, in the optical coupling device 1 according to the present embodiment, stress generated inside the device can be relaxed by the preferential peeling of the second covering material 15 and the third covering material 16. Thereby, stress which is applied to solder used to bond the light-emitting element 10 to the first surface 12a or solder used to bond the light-receiving element 11 to the third surface 13a is relaxed, and thus the heat resistance of the solder is stabilized.

In the optical coupling device 1, there is a tendency for adhesion between the lead frame 12 and the second covering material 15 to become weak due to aged-related deterioration. In this process, the lead frame 12 side of the first covering material 14 (that is, a portion of material 14 directly adjacent to the lead frame 12) tends to become oxidized and discolored (for example, brown). In order to suppress this process, it is preferable to increase the strength of adhesion (fourth adhesion strength) between the second covering material 15 and the first surface 12a by increasing the smoothness of the first surface 12a, or the like.

Second Embodiment

Figure 5A:
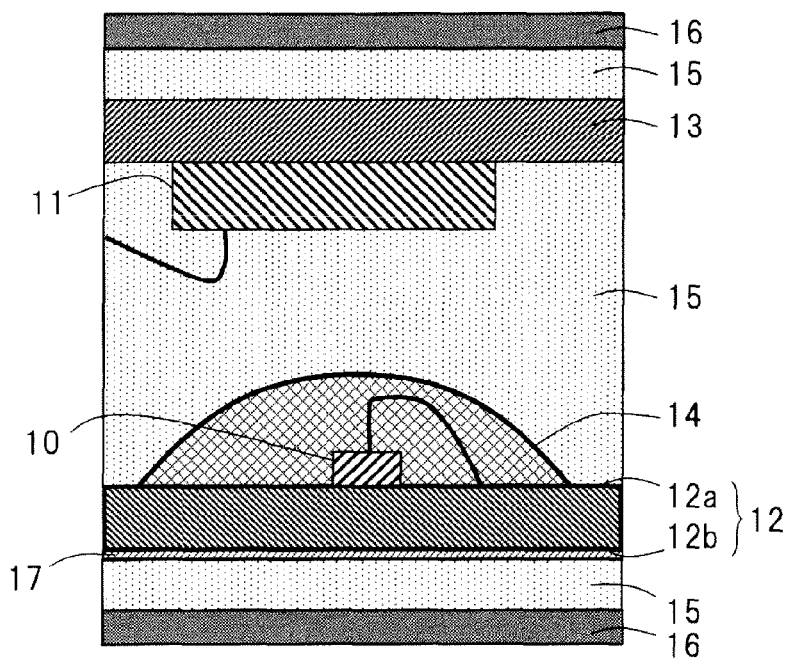
FIG. 5A is an enlarged cross-sectional view of a portion of an optical coupling device according to a second embodiment.
Figure 5B:
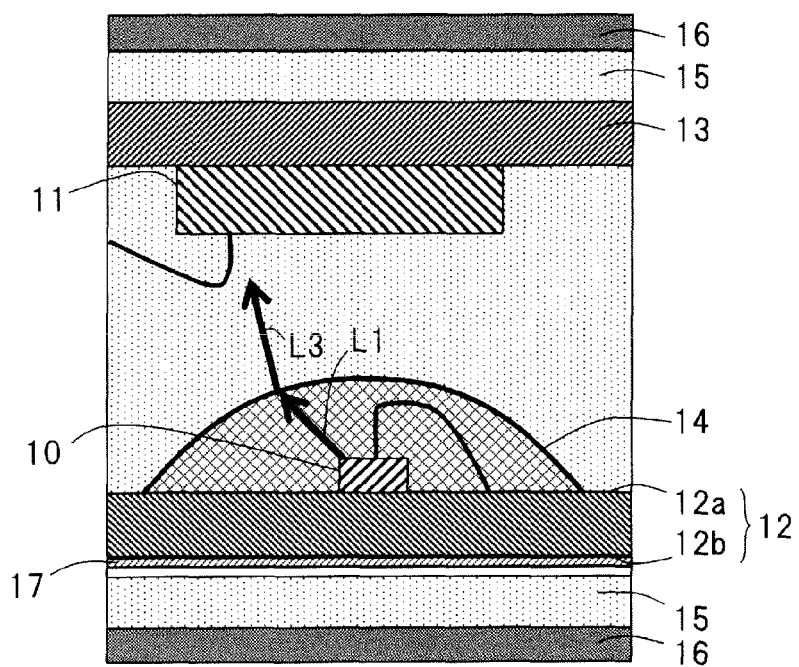
FIG. 5B is a cross-sectional view illustrating a state in which peeling has occurred at an interface between a lead frame and a second covering material in the optical coupling device illustrated in FIG. 5A.

A second embodiment will be described focusing on the differences from the first embodiment. FIG. 5A is an enlarged cross-sectional view of a portion of an optical coupling device according to the second embodiment, and FIG. 5B is a cross-sectional view illustrating a state where the lead frame 12 and the second covering material 15 have detached (peeled off) from each other in the optical coupling device illustrated in FIG. 5A.

As illustrated in FIG. 5A, the second embodiment is different from the first embodiment in that a mold releasing agent 17 is included between a second surface 12b of the lead frame 12 and the second covering material 15 instead of being included between the second covering material 15 and a third covering material 16.

In the second embodiment, the mold releasing agent 17 is applied onto the second surface 12b before the second covering material 15 is molded. Adhesion strength between the second surface 12b and the second covering material 15 is, in effect, made lower than the adhesion strength between the first covering material 14 and the second covering material 15 by the application of mold releasing agent 17. For this reason, when temperature rises, there is an increased possibility of the second surface 12b and the second covering material 15 being peeled off from each other as illustrated in FIG. 5B.

When the second surface 12b and the second covering material 15 are peeled off from each other, stress generated between the first covering material 14 and the second covering material 15 is relaxed. For this reason, adhesion between the first covering material 14 and the second covering material 15 is better maintained, and thus changes in the interface between these materials are suppressed. In other words, at an interface between elements that are not located in a light path from light-emitting element 10 to a light-receiving element 11 is promoted to maintain interfacial adhesion between elements located in the light path.

In the second embodiment, the second surface 12b and the second covering material 15 are preferentially peeled off from each other. In addition, the second covering material 15 and the third covering material 16 may also be peeled off from each other in some cases. In other words, adhesion strength at least the interface between the second covering material 15 and the third covering material 16 or the second covering material 15 and the second surface 12b is made lower than the adhesion strength at the interface between the first covering material 14 and the second covering material 15.

Modification Example

Figure 6A:
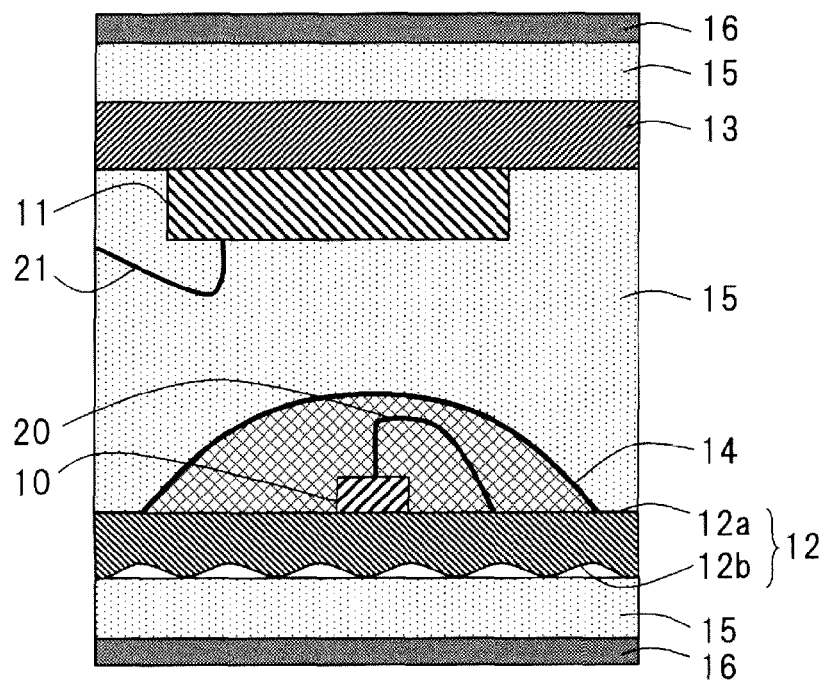
FIG. 6A is an enlarged cross-sectional view of a portion of an optical coupling device according to a modification example of the second embodiment.
Figure 6B:
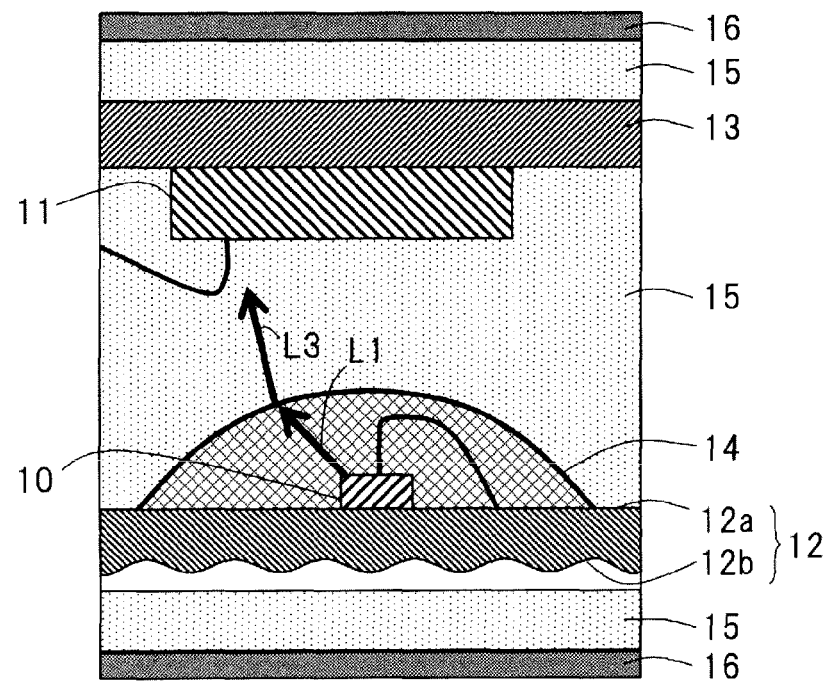
FIG. 6B is a cross-sectional view illustrating a state in which peeling has occurred at an interface between a lead frame and a second covering material in the optical coupling device illustrated in FIG. 6A.

FIG. 6A is an enlarged cross-sectional view of a portion of an optical coupling device according to a modification example of the second embodiment, and FIG. 6B is a cross-sectional view illustrating a state where a lead frame 12 and a second covering material 15 have peeled off from each other in the optical coupling device illustrated in FIG. 6A.

As illustrated in FIG. 6A, in the lead frame 12 according to the present modification example, the surface roughness of a second surface 12b is larger than the surface roughness of a first surface 12a. The relative surface roughness of each surface may be specified as, for example, an average value of measured differences in the height of irregularities per unit area.

A contact area between the (rough) second surface 12b and the second covering material 15 is consequently smaller than a contact area between the (smooth) first surface 12a and the second covering material 15 due simply to the differences in surface roughness. Total adhesion strength is a function of total contact area, therefore, as such, adhesion strength at the interface between the (rough) second surface 12b and the second covering material 15 is effectively reduced as compared to what the adhesion strength would be if the second surface 12b was smooth. This reduction in adhesion strength due to reduction in the contact area of second surface 12b and second covering material 15 can promote preferential peeling at the interface between second surface 12b and second covering material as compared to the interface between the first surface 12a and the second covering material 15.

As a result, as illustrated in FIG. 6B, the first surface 12a and the second covering material 15 are more likely to adhere to each other because the second surface 12b and the second covering material 15 will be likely to be induced to peeled off from each other first. In other words, in the present modification example, it is possible to promote peeling at the interface of the second surface 12b and the second covering material 15 without using a mold releasing agent 17 by altering the relative roughness of the first surface 12a and the second surface 12b such that contact area between the second covering material 15 and the second surface 12b is reduced in comparison to the contact area of the first surface 12a and the second covering material 15.

In the present modification example, plasma treatment or the like may be performed on the first surface 12a of the lead frame 12. The flatness of the first surface 12a may be improved by the plasma treatment process, and thus adhesion between the first surface 12a and the second covering material 15 will be enhanced. Even with this small difference in processing of the first surface 12a and the second surface 12b, adhesion strength between the second surface 12b and the second covering material 15 will be made lower than the adhesion strength between the first surface 12a and the second covering material 15. Accordingly, it is possible to create a state where the second surface 12b and the second covering material 15 are preferentially peeled off from each other.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An optical coupling device, comprising:
   a light-emitting element facing a light-receiving element;
   a first lead frame portion having a first upper surface on which the light-emitting element is provided and a second lower surface on a side of the first lead frame portion opposite the first upper surface;
   a first material on the first upper surface covering the light-emitting element;
   a second material surrounding the first material, the light-receiving element, and the first lead frame portion; and
   a third material surrounding the second material, wherein at least one of an adhesion strength between the second material and the third material and an adhesion strength between the second material and the second lower surface is less than an adhesion strength between the first material and the second material.

2. The device according to claim 1, wherein a mold releasing agent is between the second material and the third material.

3. The device according to claim 2, wherein the mold releasing agent is between the second material and the third material in a region facing the second lower surface.

4. The device according to claim 3, wherein the mold releasing agent is an organic material.

5. The device according to claim 4, wherein the organic material includes a long chain fatty acid.

6. The device according to claim 1, wherein a mold releasing agent is disposed at an interface between the second material and the second lower surface.

7. The device according to claim 6, wherein the mold releasing agent comprises a long-chain fatty acid.

8. The device according to claim 1, wherein the adhesion strength between the second material and the second lower surface is less than an adhesion strength between the second material and the first upper surface.

9. The device according to claim 8, wherein a surface roughness of the second lower surface is greater than a surface roughness of the first upper surface.

10. The device according to claim 1, wherein the adhesion strength between the second material and the third material is less than the adhesion strength between the second material and the second lower surface.

11. The device according to claim 1, wherein an adhesion strength between the second material and the first upper surface is less than the adhesion strength between the first material and the second material.

12. An optical coupling device, comprising:
    a light-emitting element facing a light-receiving element;
    a first lead frame portion having a first upper surface on which the light-emitting element is provided and a second lower surface opposite the first upper surface;
    a silicone resin on the first upper surface and covering the light-emitting element;
    a transparent inner molding resin surrounding the silicone resin, the light-receiving element, and the first lead frame portion;
    a light shielding outer molding resin surrounding the transparent inner molding resin; and
    an organic material, wherein the organic material is disposed at a position that is one of between the transparent inner molding resin and the light shielding outer molding resin and between the transparent inner molding resin and the second lower surface.

13. The optical coupling device according to claim 12, wherein the organic material is between the transparent inner molding resin and the light shielding outer molding resin and between the transparent inner molding resin and the second lower surface.

14. The optical coupling device according to claim 12, wherein the organic material is between the transparent inner molding resin and the light shielding outer molding resin.

15. The optical coupling device according to claim 12, wherein the organic material is disposed at an interface between the transparent inner molding resin and the second lower surface.

16. The optical coupling device according to claim 12, wherein a surface roughness of the second lower surface is greater than a surface roughness of the first upper surface.

17. The optical coupling device according to claim 12, further comprising:
    a bonding wire within the silicone resin electrically connecting the light-emitting element to the first upper surface of the first lead frame portion.

* * * * *